United States Patent
Yamasuge et al.

(10) Patent No.: US 8,327,239 B2
(45) Date of Patent: Dec. 4, 2012

(54) COMMUNICATION DEVICE, COMMUNICATION METHOD, AND COMPUTER PROGRAM

(75) Inventors: Hiroyuki Yamasuge, Tokyo (JP); Mitsuhiro Suzuki, Chiba (JP)

(73) Assignee: Sony Corporation, Tokyo (JP)

( * ) Notice: Subject to any disclaimer, the term of this patent is extended or adjusted under 35 U.S.C. 154(b) by 1093 days.

(21) Appl. No.: 12/026,055

(22) Filed: Feb. 5, 2008

(65) Prior Publication Data

US 2008/0201627 A1 Aug. 21, 2008

(30) Foreign Application Priority Data

Feb. 19, 2007 (JP) ................ P2007-037718

(51) Int. Cl.
*H03M 13/00* (2006.01)

(52) U.S. Cl. ........ 714/784; 714/786; 714/755; 714/776; 714/795; 375/341; 375/262

(58) Field of Classification Search .............. 714/768, 714/782, 784–785, 746, 758, 755, 786, 776; 375/262, 341

See application file for complete search history.

(56) References Cited

U.S. PATENT DOCUMENTS

| | | | | |
|---|---|---|---|---|
| 2005/0207350 | A1* | 9/2005 | Bloebaum | 370/252 |
| 2009/0055715 | A1* | 2/2009 | Jashek et al. | 714/776 |

FOREIGN PATENT DOCUMENTS

| | | |
|---|---|---|
| JP | 02-023575 | 1/1990 |
| JP | 05-260021 | 10/1993 |
| JP | 09-093143 | 4/1997 |
| JP | 09-270053 | 10/1997 |
| JP | 2000-122962 | 4/2000 |
| JP | 2001-007775 | 1/2001 |
| JP | 2006-325023 | 11/2006 |

OTHER PUBLICATIONS

ECMA-368 1st Edition / Dec. 2005 High Rate Ultra Wideband PHY and MAC Standard (http://www.ecma-international.org/publications/standards/Ecma-368.htm).

* cited by examiner

*Primary Examiner* — Guy Lamarre

(74) *Attorney, Agent, or Firm* — Finnegan, Henderson, Farabow, Garrett & Dunner. L.L.P.

(57) ABSTRACT

A communication device configured to perform packet reception processing, with the header of a packet including a header sequence and a Reed-Solomon code, includes: a header check sequence inspecting unit configured to detect, based on the header check sequence included in a received packet header, an error of the header; a Reed-Solomon encoding unit configured to encode the header of a received packet other than the Reed-Solomon code to generate a Reed-Solomon code; a Reed-Solomon code inspecting unit configured to detect whether or not the Reed-Solomon code generated by the Reed-Solomon encoding unit is completely identical to the Reed-Solomon code within the received packet header; and a processing control unit configured to control payload processing of a received packet in accordance with the inspection results of the header check sequence inspecting unit and the Reed-Solomon code inspecting unit.

20 Claims, 4 Drawing Sheets

COMMUNICATION DEVICE, COMMUNICATION METHOD, AND COMPUTER PROGRAM

CROSS REFERENCES TO RELATED APPLICATIONS

The present invention contains subject matter related to Japanese Patent Application JP 2007-037718 filed in the Japanese Patent Office on Feb. 19, 2007, the entire contents of which are incorporated herein by reference.

BACKGROUND OF THE INVENTION

1. Field of the Invention

The present invention relates to a communication device, communication method, and computer program, operating on a stored and forward switching communication system, to perform reception processing of packets sent from other communication stations, and particularly relates to a communication device, communication method, and computer program, performing reception processing of payloads based on header signals included in packets.

More specifically, the present invention relates to a communication device, communication method, and computer program, performing payload reception operations in accordance with header error detection results, and particularly relates to a communication device, communication method, and computer program, performing accurate header error detection so as to avoid reception of useless payloads.

2. Description of the Related Art

There has been given much attention in recent years to a wireless communication format called ultra-wideband (UWB) communication, which enables high-speed transmission of 100 Mbps or faster, using an extremely wide bandwidth. For example, in the USA, the FCC (Federal Communications Commission) stipulates the spectrum mask for UWB transmission at 3.1 GHz to 10.6 GHz in an indoor environment. UWB communication is more suited for close-distance communication because of the transmission power thereof, but is capable of high-speed transmission. Accordingly, application to PAN (Personal Area Network) with a communication distance of around 10 m is envisioned, and there are expectations that UWB will be put to practical use as a wireless communication realizing close-range ultrahigh-speed transmission.

Also, there are expectations for OFDM (Orthogonal Frequency Division Multiplexing) as a technique for realizing increased speed and quality of wireless communication by avoiding deterioration in transmission quality due to fading of wireless signals. For example, the IEEE 802.15.3a standardization group has defined that DSSS (Direct Sequence Spread Spectrum)-UWB, which maximizes the spread speed of DS (Direct Spread) information signals, and also OFDM_UWB employing OFDM modulation, be employed for UWB transmission, and prototypes have been tested for each format.

Another format known for flexibly changing the frequency being used is FH (Frequency Hopping), wherein communication may be incapacitated due to effects of other systems, but communication hardly ever cuts out since the frequency is constantly being changed. That is to say, FH can coexist with other systems, has excellent anti-fading properties, and is readily scalable.

For example, the IEEE 802.15.3 standardization group is contemplating dividing the bandwidth from 3.1 GHz to 10.6 GHz set by the FCC for OFDM_UWB into multiple 528-MHz sub-bands and frequency-hopping the sub-bands, i.e., implementing OFDM_UWB as a multi-band method (hereafter referred to as "MB-OFDM"). The discussion of the IEEE 802.15.3 task group (TG3a) has been taken as an ECMA (European Computer Manufacturer Association) standard with very little change, and ECMA-368 specifies a PHY layer and MAC layer for UWB communication systems (e.g., see http://www.ecma-international.org/publications/standards/Ecma-368.htm).

Now, stored and forward switching communication systems generally employ packet communication wherein transmission data is assembled into transmission units called packets and transmitted/received between communication stations. A packet is basically configured of a preamble made up of a known training sequence, a PLCP (Physical Layer Convergence Protocol) header serving as a PHY header, and a PSDU (Physical Layer Service Data Unit) serving as a PHY payload. FIG. 4 illustrates a format example of a packet (PHY frame) in an ECMA standard. As shown in the drawing, a PLCP header includes important information such as the MAC header and PHY header.

The ECMA standards do not provide detailed stipulations regarding the configuration or behavior of receivers. Generally, receivers use the preamble to perform packet detection and synchronization detection, perform automatic gain control of low-noise amplifier, perform frequency offset correction, and so forth. Subsequently, the receiver checks the HCS (Header Check Sequence) included in the header, and receives the payload only in the event that the HCS is correct; otherwise, the payload is not received. An HCS is a signal configured of 16 bits in length for example, for determining whether or not there is error in the header.

FIG. 5 schematically illustrates the configuration of a receiver for performing packet reception processing. Also, the procedures for reception operations performed by the receiver shown in the drawing are shown in the flowchart in FIG. 6.

First, a Viterbi decoder reproduces a data stream with the maximum likelihood, i.e., with the highest probability, from data with noise included, and then in the descrambler thereafter, the data stream is descrambled (step S1). The header portion is separated out from the data stream, an HCS inspector calculates the HCS based on the PHY header and MAC header, which is matched against the HCS to be read next, thereby detecting error in the header (step S2). Only in the event that the HCS matches (Yes in step S2) is the payload received (step S3). In the event that the HCS does not match (No in step S2), the payload is not received (step S4).

However, there is the possibility that the synchronization circuit in the receiver may start reception synchronous with noise added to the reception signals instead of the preamble. In this case, the HCS is only 16 bits long, so erroneous determination may be made that the HCS is correct even though there is no information which should be received (erroneous determination occurs with a probability of $\frac{1}{2^{16}}$), and further, payload reception will start. As a result, even if signals which originally should be received arrive while receiving the payload, reception cannot be performed, so the number of times of retransmission increases, leading to deterioration in throughput.

With the frame format shown in FIG. 4, 48-bit long Reed-Solomon parity bits are transmitted in the header following the HCS. Note that Reed-Solomon code is a type of forward error-correction code whereby data error can be detected and corrected, and more specifically is a mathematical error correction method for correcting continuously-occurring errors (bursts of error), and is understood to have high error correction capabilities. Reed-Solomon code is employed with QR code, storage such as CDs, DVDs, hard disks and so forth, and communication such as ADSL and space telecommunication, for example.

While major standards relating to MB-OFDM, such as ECMA-368, state that adding the Reed-Solomon parity bits to the header at the transmitter is essential, whether or not to decode this at the receiver side is left optional.

FIG. 7 schematically illustrates the configuration of a receiver for performing packet reception processing. The procedures for reception operations performed by the receiver shown in the drawing are the same as with FIG. 6. That is, first, a Viterbi decoder reproduces a data stream with the highest probability from data with noise included. In the Reed-Solomon decoder thereafter, the Reed-Solomon parity bits are decoded, header signal error is detected, and correction thereof is performed. At the descrambler, the data stream is descrambled (step S1). The header portion is separated out from the data stream, an HCS inspector calculates the HCS based on the PHY header and MAC header, which is matched against the HCS to be read next, thereby detecting error in the header (step S2). Only in the event that the HCS matches is the payload received (step S3); in the event that the HCS does not match, the payload is not received (step S4).

The Reed-Solomon code decoding processing itself is widely-know, so description thereof will not be given here. Decoding the Reed-Solomon parity bits and detecting and correcting header signal information markedly reduces the probability of erroneous determination as compared with cases of only performing the HCS check. Accordingly, useless payload reception operations due to using only the HCS check can be avoided.

For example a proposal has been made regarding a decoding device wherein, even in the event that correct decoding could not be made at the Viterbi decoder when receiving and decoding TS (transport Stream) packets, the data can be repaired and corrected to the correct values with a Reed-Solomon decoder having correction capabilities of up to 8 bytes per TS packet (e.g., see Japanese Unexamined Patent Application Publication No. 2006-325023, paragraph 0035)

SUMMARY OF THE INVENTION

However, Reed-Solomon parity bit decoding requires processing time of around one microsecond, meaning that the header processing may not be completed in time for the arrival of the payload. With high-speed communication such as MB-OFDM in particular, such delay due to decoding processing is a critical issue.

There has been recognized a need for an excellent communication device and communication method, and computer program, whereby reception operation of a payload can be suitably performed in accordance with the detection result of a header error.

There has been recognized further a need for an excellent communication device and communication method, and computer program, whereby detection of a header error can be performed accurately, and reception of a useless payload is avoidable.

According to an embodiment of the present invention a communication device, configured to perform packet reception processing, with the header of a packet including a header sequence and a Reed-Solomon code, includes: a header check sequence inspecting unit configured to detect, based on the header check sequence included in a received packet header, an error of the header; a Reed-Solomon encoding unit configured to encode the header of a received packet other than the Reed-Solomon code to generate a Reed-Solomon code; a Reed-Solomon code inspecting unit configured to detect whether or not the Reed-Solomon code generated by the Reed-Solomon encoding unit is completely identical to the Reed-Solomon code within the received packet header; and a processing control unit configured to control payload processing of a received packet in accordance with the inspection results of the header check sequence inspecting unit and the Reed-Solomon code inspecting unit.

For example, with a packet-switched communication system such as MB-OFDM, a common method is employed wherein there is provided an HCS within a packet header, the receiver side detects an error of a header signal using this HCS, receives a payload only when the HCS is correct, and does not perform reception of a payload when the HCS is incorrect.

Note however, the HCS is configured of a short bit length such as 16 bits or the like for example, for example, when receiving noise, even if a synchronizing circuit takes synchronization erroneously to start reception, there is a possibility that erroneous recognition is made such that the HCS happens to be correct, and reception of a payload is started. In such a case, there is a possibility that while the receiver is performing reception processing wherein noise is being confused with being a payload, a signal which should be taken with synchronization and received is actually input. At this time, the receiver cannot receive the signal which should be received, which is accordingly sent again, resulting in deterioration of throughput.

On the other hand, the communication device according to this configuration of an embodiment of the invention serves as a receiver for receiving packets with a packet-switched communication system such as MB-OFDM for example, but when receiving a packet where the header includes an HCS and a Reed-Solomon parity bit, is configured to perform an HCS check, and also performs a parity check between a Reed-Solomon parity bit obtained by subjecting a received header signal to Reed-Solomon encoding processing and a Reed-Solomon parity bit included in a received header signal.

Accordingly, the communication device according to the embodiment of the invention can detect header error with extremely high precision as compared with a receiver which performs no Reed-Solomon decoding processing but the HCS check alone in order to avoid processing delay, and accordingly, can not only avoid reception of a useless payload but also can maintain throughput.

Also, the communication device according to an embodiment of the invention performs the parity check by subjecting a received header to Reed-Solomon encoding processing as well as the HCS check, but this is processing with a low load as compared with Reed-Solomon encoding processing, and accordingly, there is no possibility that header processing might be delayed beyond reception of the payload.

Next, the communication device according to an embodiment of the invention receives a payload only when the HCS check and the parity check of a Reed-Solomon parity bit have both been successful, otherwise does not perform reception of a payload, whereby reception of a useless payload can be avoided and also throughput can be maintained.

Also, according to an embodiment of the present invention, a computer program described in a computer-readable format so as to execute packet reception processing on a computer, with the header of a packet including a header sequence and a Reed-Solomon code, causes a computer to execute the steps of: inspecting of a header check sequence, to detect an error of the header, based on the header check sequence included in a received packet header; encoding of a Reed-Solomon code, to encode the header of a received packet other than the Reed- Solomon code to generate a Reed-Solomon code; inspecting of a Reed-Solomon code, to inspect whether or not the Reed-Solomon code generated by the encoding of a Reed-Solomon code is completely identical to the Reed-Solomon code within the received packet header; and controlling of processing, to control payload processing of a received packet in accordance with the inspection results of the inspecting of a header check sequence and the inspecting of a Reed-Solomon code.

The computer program according to an embodiment of the invention can be defined as a computer program which is described in a computer-readable format so as to realize predetermined processing on a computer. In other words, the computer program according to an embodiment of the invention is installed into a computer, whereby collaboration operation is exhibited on the computer, and the same operations and advantages as those in the communication device according to an embodiment of the invention described above can be obtained.

According to an embodiment of the present invention, there are provided an excellent communication device and communication method, and computer program whereby detection of a header error can be performed accurately, and reception of a useless payload is avoidable.

A communication device according to an embodiment of the present invention is configured so as to perform the HCS check when receiving a packet where the header includes an HCS and a Reed-Solomon parity bit, and also perform the parity check between a Reed-Solomon parity bit obtained by subjecting a received signal to the Reed-Solomon encoding processing and a Reed-Solomon parity bit included in a received header signal. Accordingly, a header error can be detected with extremely high precision as compared with the case of the HCS check alone. Also, Reed-Solomon decoding processing is not performed, so the problem wherein header processing is delayed is not caused. Subsequently, only in the case of both of the HCS check and parity check being successful, a payload is received, otherwise, reception of a payload is not performed, whereby not only reception of a useless payload can be avoided but also throughput can be maintained.

Further other embodiments, features, and advantages will be apparent with detailed description based on later-described embodiments of the present invention and the appended drawings.

DESCRIPTION OF THE PREFERRED EMBODIMENTS

Figure 4:
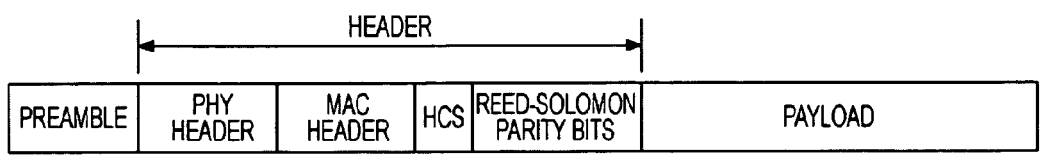
FIG. 4 is a diagram illustrating an example of the format of a packet (PHY frame)
Figure 5:
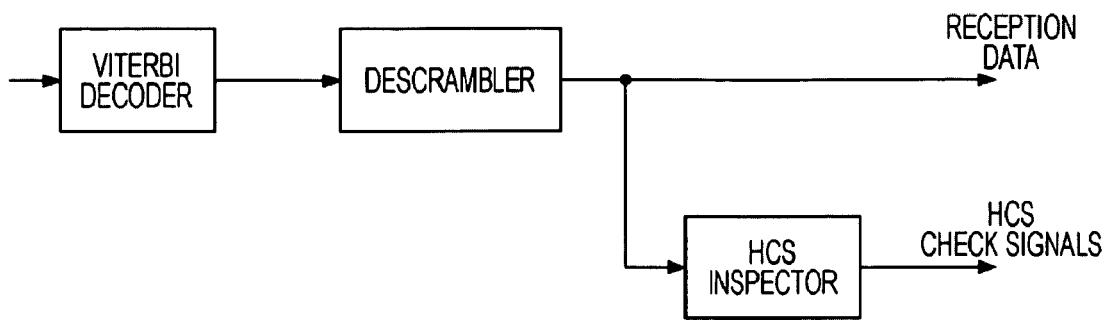
FIG. 5 is a diagram schematically illustrating the configuration of a receiver for performing packet reception processing.
Figure 6:
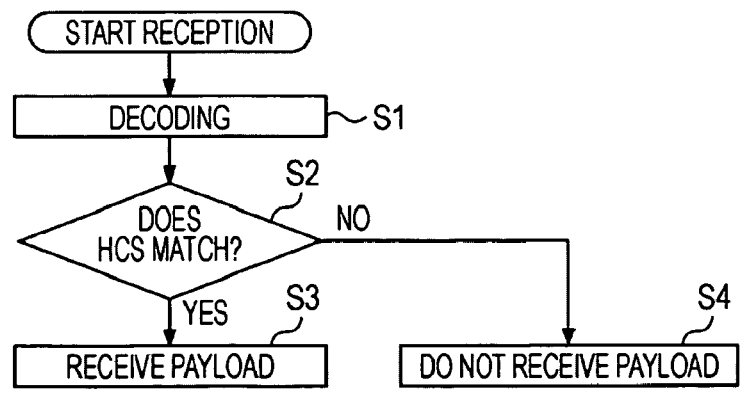
FIG. 6 is a flowchart illustrating the procedures for the reception operations at the receiver shown in FIG. 5.
Figure 7:
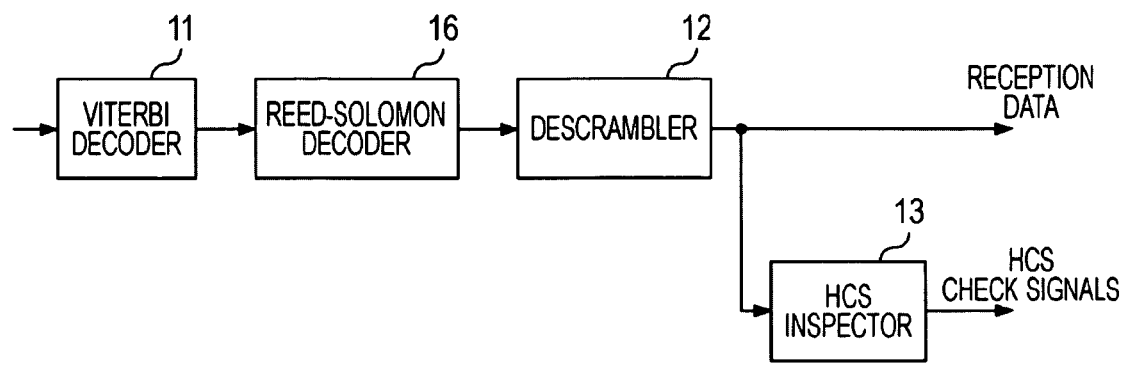
FIG. 7 is a diagram schematically illustrating the configuration of a receiver for decoding Reed-Solomon parity bits in headers.

An embodiment of the present invention will be described in detail with reference to the drawings. The embodiment relates to a communication device which operates in a stored and forward switching communication system, such as MB-OFDM for example. Note that with this communication system, packet headers include the HCS for header error detection, and Reed-Solomon parity bits for header error detection and correction (see FIG. 4).

Figure 1:
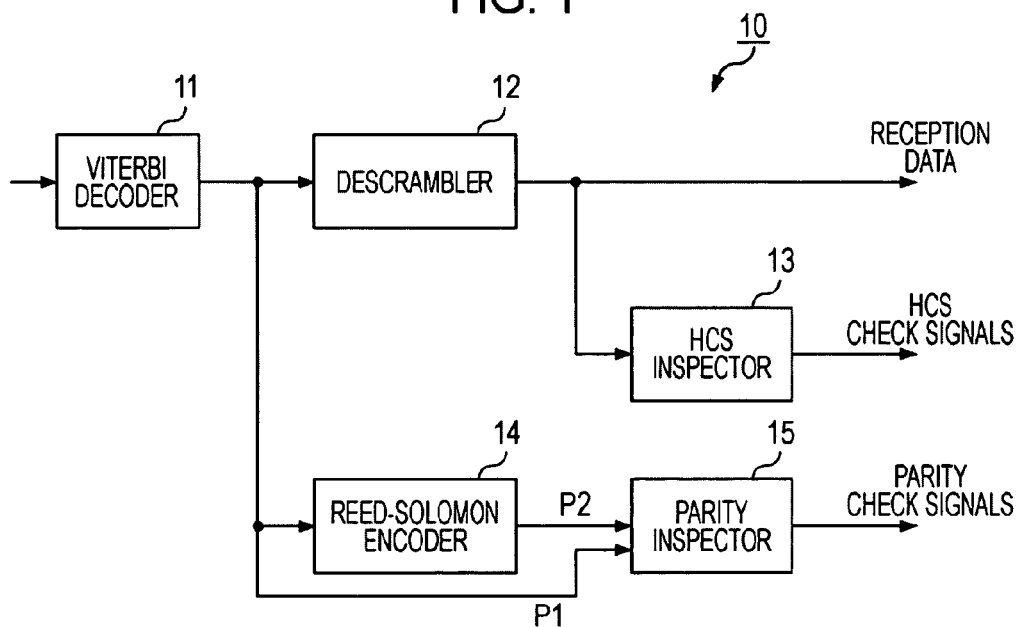
FIG. 1 is a diagram schematically illustrating the configuration of a receiver portion of a communication device according to an embodiment of the present invention.
Figure 2:
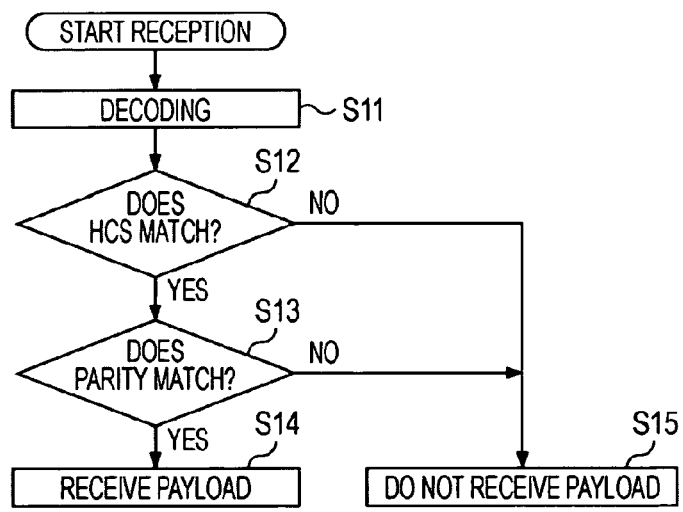
FIG. 2 is a flowchart illustrating the procedures for the reception operations at a receiver 10.

FIG. 1 is a diagram schematically illustrating the configuration of a receiver portion of a communication device according to the present embodiment. A receiver 10 includes a Viterbi decoder 11, a descrambler 12, an HCS inspector 13, a Reed-Solomon encoder 14, and a parity inspector 15. FIG. 2 is a flowchart illustrating the procedures for the reception operations at the receiver 10.

First, the Viterbi decoder 11 reproduces a data stream with the highest probability from data with noise included, and then in the descrambler 12 thereafter, the data stream is descrambled (step S11).

The header portion is separated out from the data stream, the HCS inspector 13 calculates the HCS based on the PHY header and MAC header, which is matched against the HCS to be read next, thereby detecting error in the header (step S12). In the event that the HCS check detects error in the header (No in step S12), the payload is not received (Step S15).

On the other hand, in the event that the HCS check detects no error in the header the Reed-Solomon parity bit check is performed (step S13). Specifically, all of the output signals of the Viterbi decoder 11 other than the Reed-Solomon parity bits P1 are input to the Reed-Solomon encoder 14, and Reed-Solomon parity bits P2 are generated. The following parity inspector 15 compares the Reed-Solomon parity bits P1 included in the output signals of the Viterbi decoder 11 with the Reed-Solomon parity bits P2 generated by the Reed-Solomon encoder 14, performing a parity check based on whether the two completely match.

Now, in the event that P1 and P2 match, i.e., the Reed-Solomon parity check is determined to be correct (Yes in step S13), payload reception processing is then performed (step S14). On the other hand, in the event that P1 and P2 do not match, i.e., the Reed-Solomon parity check is determined to be incorrect (No in step S13), payload reception processing is not performed (step S15).

In the event that payload reception is not performed in step S15, a MAC layer processing unit (not shown) is notified that the parity check signal is incorrect, or the MAC layer processing unit is notified using an HCS check signal.

Thus, checking matching of Reed-Solomon parity bits in addition to the HCS check enables improved error detection capabilities. Not receiving reception of the payload when an error is detected allows throughput to be maintained. With the receiver 10 shown in FIG. 1, Reed-Solomon decoding processing for using Reed-Solomon parity bits in header signal detection is not performed, so there is no problem of the delay in time due to header processing.

Figure 3:
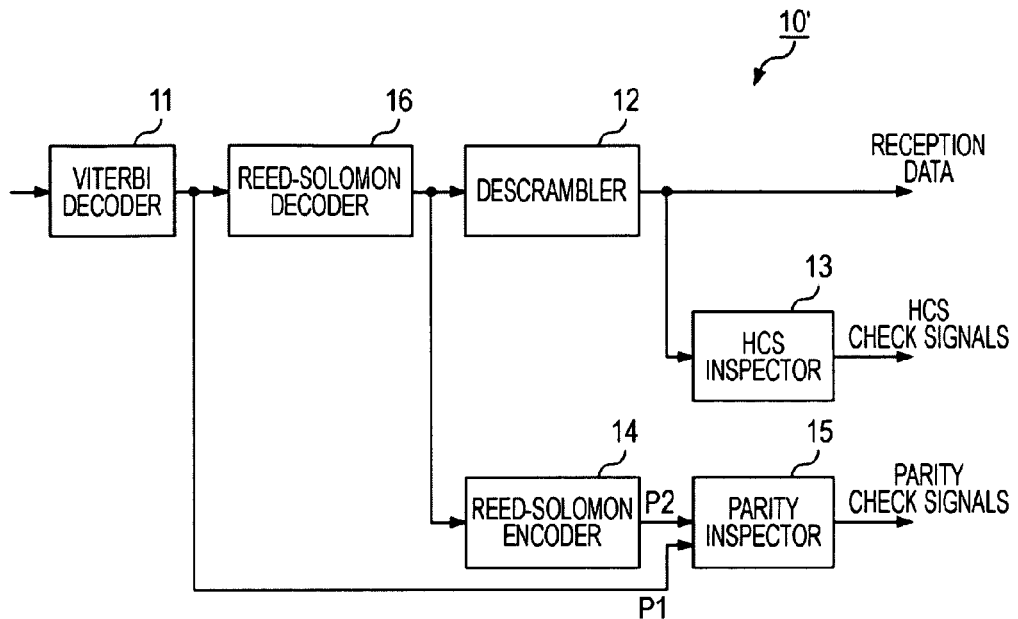
FIG. 3 is a diagram schematically illustrating the configuration of a receiver performing Reed-Solomon decoding.

Of course, embodiments of the present invention can be applied in cases of performing Reed-Solomon decoding as well. FIG. 3 is a diagram schematically illustrating the receiver configuration for performing Reed-Solomon decoding. A receiver 10' includes the Viterbi decoder 11, descrambler 12, HCS inspector 13, Reed-Solomon encoder 14, parity inspector 15, and also a Reed-Solomon decoder 16. The reception operations of the receiver 10' are the same as with those shown in FIG. 2.

First, the Viterbi decoder 11 reproduces a data stream with the highest probability from data with noise included, and then in the following Reed-Solomon decoder 16, the Reed-Solomon parity bits are used to perform header signal error detection and correction thereof. The descrambler 12 descrambles the data stream (step S11).

The header portion is separated out from the data stream, the HCS inspector 13 calculates the HCS based on the PHY header and MAC header, which is matched against the HCS to be read next, thereby detecting error in the header (step S12). In the event that the HCS check detects error in the header (No in step S12), the payload is not received (Step S15).

On the other hand, in the event that the HCS check detects no error in the header the Reed-Solomon parity bit check is performed (step S13). Specifically, all of the output signals of the Viterbi decoder 11 other than the Reed-Solomon parity bits P1 are input to the Reed-Solomon encoder 14, and Reed-Solomon parity bits P2 are generated. The following parity inspector 15 compares the Reed-Solomon parity bits P1 included in the output signals of the Viterbi decoder 11 with the Reed-Solomon parity bits P2 generated by the Reed-Solomon encoder 14, performing a parity check based on whether the two completely match.

Now, in the event that P1 and P2 match, i.e., the Reed-Solomon parity check is determined to be correct (Yes in step S13), payload reception processing is then performed (step S14). On the other hand, in the event that P1 and P2 do not match, i.e., the Reed-Solomon parity check is determined to be incorrect (No in step S13), payload reception processing is not performed (step S15).

In the event that payload reception is not performed in step S15, a MAC layer processing unit (not shown) is notified that the parity check signal is incorrect, or the MAC layer processing unit is notified using an HCS check signal.

Thus, also checking matching of Reed-Solomon parity bits with the receiver configuration shown in FIG. 3 as well enables improved error detection capabilities. Not receiving reception of the payload when an error is detected allows throughput to be maintained.

It should be understood by those skilled in the art that various modifications, combinations, sub-combinations and alterations may occur depending on design requirements and other factors insofar as they are within the scope of the appended claims or the equivalents thereof.

What is claimed is:

1. A communication device configured to perform packet reception processing, comprising:
   processing control means configured to receive a packet comprising a header and a payload, the header comprising a header check sequence and a first Reed-Solomon code;
   header check sequence inspecting means configured to determine, based on the header check sequence, that the received packet header does not include an error;
   Reed-Solomon encoding means configured to encode, in response to the determination, at least a portion of the received packet header to generate a second Reed-Solomon code, the received packet header portion being different from the first Reed-Solomon code; and
   Reed-Solomon code inspecting means is configured to determine whether a portion of the second Reed-Solomon code matches a corresponding portion of the first Reed-Solomon code,
   wherein the processing control means is further configured to process the received packet to obtain at least a portion of the payload, when the first Reed-Solomon code portion matches the second Reed-Solomon code portion.

2. The communication device of claim 1, wherein the processing control means is further configured to cancel the payload processing when the first Reed-Solomon code portion fails to match the second Reed-Solomon code portion.

3. The communication device according to claim 1, further comprising:
   Reed-Solomon decoding means configured to perform header error detection/correction by decoding the first Reed-Solomon code.

4. The communications device of claim 1, wherein:
   the header check sequence inspecting means is further configured to determine, based on the header check sequence, that the received packet header includes an error; and
   the processing control means is further configured to discard the received packet when the received packet header includes an error.

5. The communications device of claim 4, wherein the processing control means is further configured to generate a signal to notify at least one of a physical layer or a media access layer, when the received packet header includes an error.

6. The communications device of claim 1, wherein the communications device further comprises a Viterbi decoder configured to generate a signal representative of the received packet header, the generated signal comprising data associated with the header check sequence and the first Reed-Solomon code.

7. The communications device of claim 6, wherein the Reed-Solomon encoding means is further configured to:
   process the generated signal to extract the first Reed-Solomon code; and
   encoding the processed signal to generate the second Reed-Solomon code.

8. A communication device, comprising:
   header check sequence inspecting means configured to determine that a header of a packet does not include an error, the packet header comprising a first Reed-Solomon code;
   Reed-Solomon encoding means configured to encode, in response to the determination, at least a portion of the packet header to generate a second Reed-Solomon code, the packet header portion being different from the first Reed-Solomon code;
   Reed-Solomon code inspecting means configured to determine whether a portion of the second Reed-Solomon code matches a corresponding portion of the first Reed-Solomon code; and
   processing control means configured to process at least a portion of a payload of the packet, when the second Reed-Solomon code portion matches the first Reed-Solomon code portion.

9. The communication device of claim 8, wherein the processing control means is further configured to cancel the payload processing when the first and second Reed-Solomon code portions do not match.

10. The communication device according to claim 8, further comprising:
    Reed-Solomon decoding means configured to perform header error detection/correction by decoding the first Reed-Solomon code.

11. The communications device of claim 8, wherein:
    the header check sequence inspecting means is further configured to determine that the packet header includes an error; and the processing control means is further configured to generate an instruction to prevent receipt of the packet payload, when the packet header includes an error.

12. The communications device of claim 8, further comprising means for receiving the packet payload, when the packet header does not include an error.

13. A communication method for performing packet reception processing, comprising:
receiving a packet comprising a header and a payload, the header comprising a header check sequence and a first Reed-Solomon code;
determining, based on the header check sequence, that the received packet header does not include an error;
encoding, in response to the determination, at least a portion of the received packet header to generate a second Reed-Solomon code, the received packet header portion being different from the first Reed-Solomon code;
determining whether a portion of the second Reed-Solomon code matches a corresponding portion of the first Reed-Solomon code; and
processing the received packet to obtain at least a portion of the payload of the received packet, when the second Reed-Solomon code portion matches the first Reed-Solomon code portion.

14. The method of claim 13, further comprising:
determining, based on the header check sequence, that the packet header includes an error; and
discarding the received packet when the received packet header includes an error.

15. A tangible, non-transitory computer-readable medium storing instructions that, when executed by a processor, cause the processor to execute a method comprising:
receiving a packet comprising a header and a payload, the header comprising a header check sequence and a first Reed-Solomon code;
determining, based on the header check sequence, that the received packet header does not include an error;
encoding, in response to the determination, at least a portion of the received packet header to generate a second Reed-Solomon code, the received packet header portion being different from the first Reed-Solomon code;
determining whether a portion of the second Reed-Solomon code matches a corresponding portion of the first Reed-Solomon code; and
processing the received packet to obtain at least a portion of the, to payload of the received packet, when the second Reed-Solomon code portion matches the first Reed-Solomon code portion.

16. A communication device configured to perform packet reception processing, comprising:
a processing control unit configured to receive a packet comprising a header and a payload, the header comprising a header check sequence and a first Reed-Solomon code;
a header check sequence inspecting unit configured to determine, based on the header check sequence, that the received packet header does not include an error;
a Reed-Solomon encoding unit configured to encode, in response to the determination, at least a portion of the received packet header to generate a second Reed-Solomon code, the received packet header portion being different from the first Reed-Solomon code;
a Reed-Solomon code inspecting unit configured to determine whether a portion of the second Reed-Solomon code matches a corresponding portion of the first Reed-Solomon code,
wherein the processing control unit is further configured to process the received packet to obtain at least a portion of the payload, when the first Reed-Solomon code portion matches the second Reed-Solomon code portion.

17. The communications device of claim 16, wherein:
the header check sequence inspecting unit is further configured to determine, based on the header check sequence, that the received packet header includes an error; and
the processing control unit is further configured to discard the received packet when the received packet header includes an error.

18. A communication device, comprising:
a header check sequence inspecting unit configured to determine that a header of a packet does not include an error, the packet header comprising a first Reed-Solomon code;
a Reed-Solomon encoding unit configured to encode, in response to the determination, the packet header to generate a second Reed-Solomon code, the packet header portion being different from the first Reed-Solomon code;
a Reed-Solomon code inspecting unit configured to determine whether a portion of the second Reed-Solomon code matches a corresponding portion of the first Reed-Solomon code; and
a processing control unit configured to process at least a portion of a payload of the packet, when the second Reed-Solomon code portion matches the first Reed-Solomon code portion.

19. The communications device of claim 18, further comprising a receiving unit configured to receive the packet payload, when the packet header does not include an error.

20. The communications device of claim 18, wherein:
the header check sequence inspecting unit is further configured to determine that the packet header packet includes an error; and
the processing control unit is further configured to generate an instruction to prevent receipt of the packet payload, when the packet header includes an error.

* * * * *